US006756323B2

United States Patent
Grill et al.

(10) Patent No.: US 6,756,323 B2
(45) Date of Patent: Jun. 29, 2004

(54) METHOD FOR FABRICATING AN ULTRALOW DIELECTRIC CONSTANT MATERIAL AS AN INTRALEVEL OR INTERLEVEL DIELECTRIC IN A SEMICONDUCTOR DEVICE

(75) Inventors: Alfred Grill, White Plains, NY (US); Vishnubhai V. Patel, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 346 days.

(21) Appl. No.: 09/938,949

(22) Filed: Aug. 24, 2001

(65) Prior Publication Data

US 2002/0098714 A1 Jul. 25, 2002

Related U.S. Application Data

(63) Continuation-in-part of application No. 09/769,089, filed on Jan. 25, 2001, now Pat. No. 6,441,491.

(51) Int. Cl.⁷ ............................................. H01L 21/31
(52) U.S. Cl. ...................................................... 438/780
(58) Field of Search ................................. 438/778, 780, 438/781, 789, 788

Primary Examiner—David Nelms
Assistant Examiner—Quoc Hoang
(74) Attorney, Agent, or Firm—Scully, Scott, Murphy & Presser; Robert M. Trepp, Esq.

(57) ABSTRACT

A method for fabricating a thermally stable ultralow dielectric constant film comprising Si, C, O and H atoms in a parallel plate chemical vapor deposition process utilizing plasma enhanced chemical vapor deposition ("PECVD") process is disclosed. To enable the fabrication of thermally stable ultralow dielectric constant film, specific precursor materials are used, such as, cyclic siloxanes and organic molecules containing ring structures, for instance, tetramethylcycloterasiloxane and cyclopentene oxide. To stabilize plasma in the PECVD reactor and thereby improve uniformity of the deposited film, $CO_2$ is added to TMCTS as a carrier gas, or $CO_2$ or a mixture of $CO_2$ and $O_2$ are added to the PECVD reactor.

64 Claims, 2 Drawing Sheets where m = 0 to 5 and n = 0 to 10 where l = 0 to 5, m = 0 to 10; and n = 0 to 10

METHOD FOR FABRICATING AN ULTRALOW DIELECTRIC CONSTANT MATERIAL AS AN INTRALEVEL OR INTERLEVEL DIELECTRIC IN A SEMICONDUCTOR DEVICE

CROSS-REFERENCE TO RELATED APPLICATIONS

The present application is a continuation in part of U.S. patent application Ser. No. 09/769,089 to Alfred Grill, et al., entitled "An Ultralow Dielectric Constant Material as an Intralevel or Interlevel Dielectric in a Semiconductor Device and Electronic Device Containing the Same" and filed Jan. 25, 2001 now U.S. Pat. No. 6,441,491, and the present application further claims the benefit of U.S. provisional application Ser. No. 60/243,169 to Alfred Grill, et al., entitled "An Ultralow Dielectric Constant Material as an Intralevel or Interlevel Dielectric in a Semiconductor Device and Electronic Device Containing the Same" and filed Oct. 25, 2000.

BACKGROUND OF THE INVENTION

1. Technical Field of the Invention

The present invention generally relates to a method for fabricating a dielectric material that has an ultralow dielectric constant (or ultralow-k) associated therewith. More particularly, the present invention relates to an improved method for fabricating a thermally stable ultralow-k film for use as an intralevel or interlevel dielectric in an ultra-large-scale integration ("ULSI") back-end-of-the-line ("BEOL") wiring structure.

2. Description of the Prior Art

The continuous shrinking in dimensions of electronic devices utilized in ULSI circuits in recent years has resulted in increasing the resistance of the BEOL metallization as well as increasing the capacitance of the intralayer and interlayer dielectric. This combined effect increases signal delays in ULSI electronic devices. In order to improve the switching performance of future ULSI circuits, low dielectric constant (k) insulators and particularly those with k significantly lower than silicon oxide are needed to reduce the capacitances. Dielectric materials (i.e., dielectrics) that have low-k values have been commercially available. For instance, one such material is polytetrafluoroethylene ("PTFE"), which has a k value of 2.0. However, these dielectric materials are not thermally stable when exposed to temperatures above 300~350° C. Integration of these dielectrics in ULSI chips requires a thermal stability of at least 400° C. Consequently, these dielectrics are rendered useless during integration.

The low-k materials that have been considered for applications in ULSI devices include polymers containing Si, C, O, such as methylsiloxane, methylsilsesquioxanes, and other organic and inorganic polymers. For instance, a paper (N. Hacker et al. "Properties of new low dielectric constant spin-on silicon oxide based dielectrics." *Mat. Res. Soc. Symp. Proc.* 476 (1997):25) described materials that appear to satisfy the thermal stability requirement, even though some of these materials propagate cracks easily when reaching thicknesses needed for integration in the interconnect structure when films are prepared by a spin-on technique. Furthermore, the precursor materials are high cost and prohibitive for use in mass production. In contrast to this, most of the fabrication steps of very-large-scale-integration ("VLSI") and ULSI chips are carried out by plasma enhanced chemical or physical vapor deposition techniques.

The ability to fabricate a low-k material by a plasma enhanced chemical vapor deposition ("PECVD") technique using readily available processing equipment will simplify the material's integration in the manufacturing process, reduce manufacturing cost, and create less hazardous waste. A co-pending application (Hydrogenated Oxidized Silicon Carbon Material, U.S. Ser. No. 09/107,567, filed on Jun. 19, 1998) assigned to the common assignee of the present invention and incorporated herein by reference in its entirety, described an ultralow dielectric constant material, consisting of Si, C, O and H atoms, having a dielectric constant not more than 3.6, and exhibiting very low crack propagation velocities.

Another co-pending application (Multiphase Low Dielectric Constant Material and Method of Deposition, U.S. Ser. No. 09/320,495, filed on May 16, 1999) assigned to the common assignee of the present invention and incorporated herein by reference in its entirety, described a dual-phase material, consisting of a matrix composed of Si, C, O, and H atoms, a phase composed of mainly C and H atoms, and having a dielectric constant of not more than 3.2. It should be noted that continued reduction of the dielectric constant of such materials will further improve the performance of electronic devices incorporating such dielectrics.

In view of the foregoing, there is a continued need for developing a dielectric material that has a dielectric constant of not more than about 2.8 and inhibits cracking.

SUMMARY OF THE INVENTION

It is therefore an object of the present invention to provide an improved method for fabricating an ultralow dielectric constant material having a dielectric constant of not more than about 2.8. More preferably, the dielectric constant for the ultralow-k material is in a range of about 1.5 to about 2.5, and most preferably, the dielectric constant is in a range of about 2.0 to about 2.25. It should be noted that all dielectric constants are relative to a vacuum unless otherwise specified.

It is another object of the present invention to provide an improved method for fabricating an ultralow dielectric constant material comprising Si, C, O and H atoms from a mixture of at least two precursors, wherein a first precursor is selected from molecules with ring structures comprising SiCOH components and a second precursor is an organic molecule selected from the group consisting of molecules with ring structures.

It is a further object of the present invention to provide an improved method for fabricating an ultralow dielectric constant film in a parallel plate plasma enhanced chemical vapor deposition ("PECVD") reactor.

It is yet a further object of the present invention to provide an improved method for fabricating an ultralow dielectric constant material by depositing a film on a substrate in the presence Of $CO_2$ or $CO_2$ and $O_2$, thereby improving uniformity of the deposited film deposited and stabilizing the plasma within the PECVD reactor.

It is still a further object of the present invention to provide an improved method for fabricating an ultralow dielectric constant material for use in electronic structures as an intralevel or interlevel dielectric in a back-end-of-the-line ("BEOL") interconnect structure.

It is yet another object of the present invention to provide a thermally stable ultralow dielectric constant material that has low internal stresses and a dielectric constant of not higher than about 2.8. More preferably, the dielectric constant for the ultralow-k material is in a range of about 1.5 to about 2.5 and, most preferably, the dielectric constant is in a range of about 2.0 to about 2.25.

In accordance with the present invention, there is provided an improved method for fabricating a thermally stable dielectric material that has a matrix comprising Si, C, O, and H atoms and an atomic level nanoporosity. In a preferred embodiment, the dielectric material has a matrix that consists essentially of Si, C, O, and H. The present invention further provides an improved method for fabricating the dielectric material by reacting a first precursor gas comprising atoms of Si, C, O, and H and at least a second precursor gas comprising atoms of C, H, and optionally O, F and N in a plasma enhanced chemical vapor deposition ("PECVD") reactor. The present invention yet further provides for mixing the first precursor gas with $CO_2$, or mixing the first and second precursor gases with $CO_2$ and $O_2$, thereby stabilizing the plasma in the PECVD reactor and improving the uniformity of the film deposited on the substrate.

In a preferred embodiment, there is provided a method for fabricating a thermally stable ultralow dielectric constant (ultralow-k) film comprising the steps of: providing a plasma enhanced chemical vapor deposition ("PECVD") reactor; positioning an electronic structure (i.e., substrate) in the reactor; flowing a first precursor gas comprising atoms of Si, C, O, and H into the reactor; flowing a second precursor gas mixture comprising atoms of C, H and optionally O, F and N into the reactor; and depositing an ultralow-k film on the substrate in the presence of $CO_2$ or $CO_2$ and $O_2$. Preferably, the first precursor is selected from molecules with ring structures comprising SiCOH components such as 1, 3, 5, 7-tetramethylcyclotetrasiloxane ("TMCTS" or "$C_4H_{16}O_4Si_4$"). The second precursor may be an organic molecule selected from the group consisting of molecules with ring structures, preferably with more than one ring present in the molecule. Especially useful, are species containing fused rings, at least one of which contains a heteroatom, preferentially oxygen. Of these species, the most suitable are those that include a ring of a size that imparts significant ring strain, namely rings of 3 or 4 atoms and/or 7 or more atoms. Particularly attractive, are members of a class of compounds known as oxabicyclics, such as cyclopentene oxide ("CPO" or "$C_5H_8O$").

Optionally, the deposited film of the present invention can be heat treated at a temperature of not less than about 300° C. for a time period of at least about 0.25 hour. The method may further comprise the step of providing a parallel plate reactor, which has a conductive area of a substrate chuck between about 300 $cm^2$ and about 700 $cm^2$, and a gap between the substrate and a top electrode between about 1 cm and about 10 cm. A high frequency RF power is applied to one of the electrodes at a frequency between about 12 MHZ and about 15 MHZ. Optionally, an additional low frequency power can be applied to one of the electrodes. The heat-treating step may further be conducted at a temperature not higher than about 300° C. for a first time period and then at a temperature not lower than about 380° C. for a second time period, the second time period being longer than the first time period. The second time period may be at least about 10 times the first time period.

The deposition step for the ultralow dielectric constant film of the present invention may further comprise the steps of: setting the substrate temperature at between about 25° C. and about 400° C.; setting the high frequency RF power density at between about 0.05 W/$cm^2$ and about 2.0 W/$cm^2$; setting the first precursor flow rate at between about 5 sccm and about 1000 sccm; setting the flow rate of the second precursor between about 5 sccm and about 1000 sccm; setting the reactor pressure at a pressure between about 50 mTorr and about 5000 mTorr; and setting the high frequency RF power between about 15 W and about 500 W. Optionally, an ultralow frequency power may be added to the plasma between about 10 W and about 300 W. When the conductive area of the substrate chuck is changed by a factor of X, the RF power applied to the substrate chuck is also changed by a factor of X.

In another preferred embodiment, there is provided a method for fabricating an ultralow-k film comprising the steps of: providing a parallel plate type chemical vapor deposition reactor that has plasma enhancement; positioning a pre-processed wafer on a substrate chuck which has a conductive area of between about 300 $cm^2$ and about 700 $cm^2$ and maintaining a gap between the wafer and a top electrode between about 1 cm and about 10 cm; flowing a first precursor gas comprising cyclic siloxane molecules into the reactor; flowing at least a second precursor gas comprising organic molecules with ring structures including C, H and O atoms; and depositing an ultralow-k film on the wafer in the presence of $CO_2$ or $CO_2$ and $O_2$. The process may further comprise the step of heat-treating the film after the deposition step at a temperature of not less than about 300° C. for at least about 0.25 hour. The process may further comprise the step of applying a RF power to the wafer. The heat-treating step may further be conducted at a temperature of not higher than about 300° C. for a first time period and then at a temperature not lower than about 380° C. for a second time period, the second time period being longer than the first time period. The second time period may be at least about 10 times the first time period.

The cyclic siloxane precursor utilized can be tetramethylcyclotetrasiloxane ("TMCTS") and the organic precursor can be cyclopentene oxide ("CPO"). The deposition step for the ultralow-k film may further comprise the steps of: setting the wafer temperature at between about 25° C. and about 400° C.; setting a RF power density at between about 0.05 W/$cm^2$ and about 2.0 W/$cm^2$; setting the flow rate of the cyclic siloxane between about 5 sccm and about 1000 sccm; setting the flow rate of the organic precursor between about 5 sccm and about 1000 sccm; and setting the pressure reactor at between about 50 mTorr and about 5000 mTorr. Additionally, the deposition step may further comprise setting a flow ratio of cyclopentene oxide to tetramethylcyclotetrasiloxane to between about 0.1 and about 0.7, preferably between 0.2 and 0.4. The conductive area of the substrate chuck can be changed by a factor X, which leads to a change in RF power by the same factor X.

In still another preferred embodiment, there is provided a method for fabricating a thermally stable ultralow-k dielectric film comprising the steps of: providing a plasma enhanced chemical vapor deposition reactor of a parallel plate type; positioning a wafer on a substrate chuck that has a conductive area between about 300 $cm^2$ and about 700 $cm^2$ and maintaining a gap between the wafer and a top electrode between about 1 cm and about 10 cm; flowing a precursor gas mixture of a cyclic siloxane with a cyclic organic molecule into the reactor over the wafer, which is kept at a temperature between about room temperature and about 400° C. and preferably between about 60° C. and about 200° C., at a total flow rate between about 25 sccm and about 500 sccm while keeping the reactor pressure at between about 100 mTorr and about 5000 mTorr; depositing a dielectric film on the wafer under a RF power density between about 0.25 W/$cm^2$ and about 0.8 W/$cm^2$ in the presence of $CO_2$ or $CO_2$ and $O_2$; and annealing the ultralow-k film at a temperature of not less than about 300° C. for at least about 0.25 hour. The inventive method may further comprise the step of annealing the film at a temperature of not higher than about 300° C. for a first time period and then at a temperature not lower than about 380° C. for a second time period, wherein the second time period is longer than the first time period. The second time period may be set at least about 10 times the first time period. The cyclic siloxane precursor can be tetramethylcyclotetrasiloxane ("TMCTS") and the cyclic organic precursor can be cyclopentene oxide ("CPO").

BRIEF DESCRIPTION OF THE DRAWINGS

The foregoing objects, features and advantages of the present invention will become apparent from the following detailed description and the appended drawings in which.

DETAILED DESCRIPTION OF THE PREFERRED EMBODIMENTS OF THE INVENTION

Figure 1:
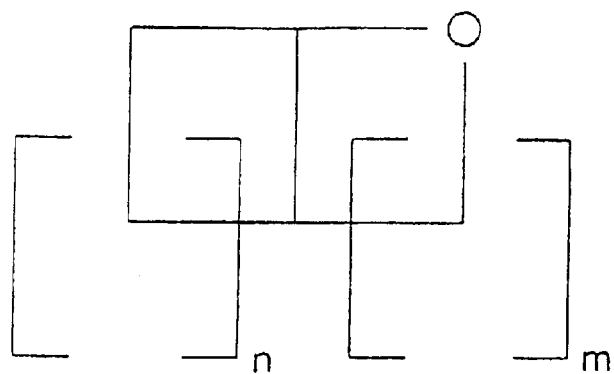
FIG. 1 depicts the general electronic structure of a bicyclic ether, also known as a oxabicyclic, which is a preferred compound for the second precursor. In this general schematic, the compound includes two rings, one of which contains an oxygen atom. The size of each ring is determined by the number of repeating methylene groups in each cycle, m and n. In a highly preferred case of cyclopentene oxide, m=0 and n=2.

The present invention discloses an improved method for fabricating a thermally stable ultralow dielectric constant film in a parallel plate plasma enhanced chemical vapor deposition ("PECVD") reactor. The material disclosed in the preferred embodiment contains a matrix of a hydrogenated oxidized silicon carbon material (SiCOH) comprising Si, C, O and H in a covalently bonded network and having a dielectric constant of not more than about 2.8, which may further contain molecular scale voids, approximately 0.5 to 20 nanometer in diameter, further reducing the dielectric constant to values below about 2.0. More preferably, the dielectric constant for the ultralow-k film is in a range of about 1.5 to about 2.5, and most preferably the dielectric constant is in a range of about 2.0 to about 2.25. To produce an ultralow-k thermally stable film, a specific geometry of the deposition reactor with specific growth conditions is necessary. For instance, in the parallel plate reactor, a conductive area of the substrate chuck should be between about 300 $cm^2$ and about 700 $cm^2$, with a gap between the substrate and a top electrode between about 1 cm and about 10 cm. A RF power is applied to the substrate. In accordance with the present invention, the ultralow dielectric constant film is formed from a mixture of a cyclic siloxane precursor such as TMCTS and a second precursor, which is an organic molecule, selected from the group consisting of molecules with ring structures, such as cyclopentene oxide in the presence of $CO_2$ or $CO_2$ and $O_2$, in a specifically configured reaction reactor under specific reaction conditions. The low dielectric constant film of the present invention can further be heat treated at a temperature not less than about 300° C. for at least about 0.25 hour to reduce the dielectric constant. During this heat treatment step, molecule fragments derived from the second precursor gas (or gas mixture) comprising carbon and hydrogen and optionally oxygen atoms may thermally decompose and may be converted into smaller molecules which are released from the film. Optionally, further development of voids may occur in the film by the process of conversion and release of the molecule fragments. The film density is thus decreased.

The present invention provides a method for preparing a material that has an ultralow dielectric constant, i.e., lower than about 2.8, which is suitable for integration in a BEOL wiring structure. More preferably, the dielectric constant for the inventive ultralow-k film is in a range of about 1.5 to about 2.5 and, most preferably, the dielectric constant is in a range of about 2.0 to about 2.25. The inventive films can be prepared by choosing at least two suitable precursors and a specific combination of processing parameters as described herein below. Preferably, the first precursor is selected from molecules with ring structures comprising SiCOH components such as 1,3,5,7-tetramethylcyclotetrasiloxane (TMCTS or $C_4H_{16}O_4Si_4$) or octamethylcyclotetrasiloxane (OMCTS or $C_8H_{24}O_4Si_4$). More generally, the first precursor is of a class of cyclic alkylsiloxanes comprising a ring structure including an equivalent number of Si and O atoms bonded in an alternating fashion to which alkyl groups (such as methyl, ethyl, propyl or higher or branched analogs as well as cyclic hydrocarbons such as cyclopropyl, cyclopentyl, cyclohexyl, and higher analogs) are covalently bonded to at least one of the silicon atoms, including the cases where all the silicon atoms have two alkyl groups attached. Such alkyl groups may be similar or dissimilar. Additionally, the silicon atoms of such cyclic siloxanes may be bonded to hydrogen, in which case these compounds may be considered partially alkylated hydrosiloxanes.

The second precursor may be chosen from organic molecules, containing C, H, and O atoms and containing at least one ring, that have suitable volatility such that they may be introduced to the deposition reactor as a vapor by manipulation of temperature and pressure. Additionally, other atoms such as N, S, Si, or halogens may be contained in the precursor molecule. Additionally, more than one ring may be present in the precursor molecule. Especially useful, are species containing fused rings, at least one of which contains a heteroatom, preferentially oxygen. Of these species, the most suitable are those that include a ring of a size that imparts significant ring strain, namely rings of 3 or 4 atoms and/or 7 or more atoms. Particularly attractive, are members of a class of compounds known as oxabicyclics. Among the readily available examples of these, are 6-oxabicyclo[3.1.0]hexane or cyclopentene oxide (bp=102° C. at 760 mm Hg); 7-oxabicyclo[4.1.0]heptane or cyclohexene oxide (bp=129° C. at 760 mm Hg); 9-oxabicyclo[6.1.0] nonane or cyclooctene oxide (bp=55° C. at 5 mm Hg); and 7-oxabicyclo[2.2.1]heptane or 1,4-epoxycyclohexane (bp=119° C. at 713 mm Hg). More generally, species that fit the formula shown in FIG. 1 may be considered suitable.

Figure 2:
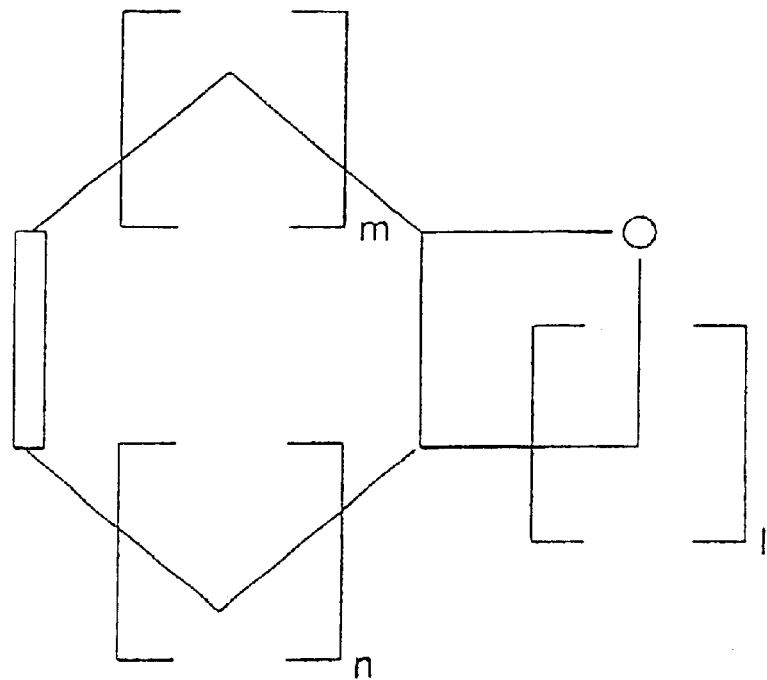
FIG. 2 depicts the general electronic structure of an unsaturated bicyclic ether, also known as a unsaturated oxabicyclic, which is a preferred compound for the second precursor. In this general schematic, the compound includes two rings, one of which contains an oxygen atom. The size of each ring is determined by the number of repeating methylene groups in each cycle, l, m and n. The position of the unsaturated bond is determined by m and n. In the example of 9-oxabicylo[6.1.0]non-4-ene, l=0, m=2 and n=2.

Additionally, the second precursor may have some degree of unsaturation as in 9-oxabicyclo[6.1.0]non-4-ene (bp=195° C. at 760 mm Hg) or compounds of the general structure shown in FIG. 2. Furthermore, the second precursor may have additional functionalities including, but not limited to: ketones, aldehydes, amines, amides, imides, ethers, esters, anhydrides, carbonates, thiols, thioethers and the like, as in 7-oxabicyclo[4.1.0]heptan-2-one (bp=77° C. at 15 mmHg) and 3-oxabicyclo[3.1.0]hexane-2,4-dione (bp=100° C. at 5 mmHg).

Furthermore, the first precursor is further mixed with $CO_2$ as a carrier gas or the first and second precursor gases are mixed with $CO_2$ or a mixture of $CO_2$ and $O_2$ in the PECVD reactor. The addition of $CO_2$ to the first precursor as a carrier gas, or the addition of $CO_2$ or a mixture of $CO_2$ and $O_2$ to the first and second precursors in the PECVD reactor provides a stabilizing effect on plasma in the PECVD reactor and improves the uniformity of the film deposited on the substrate. When $CO_2$ is admixed with the first and second precursors, the amount of $CO_2$ may be from about 25 sccm to about 1000 sccm, and more preferably from about 50 sccm to about 500 sccm. When a mixture of $CO_2$ and $O_2$ is admixed with the first and second precursors, the amount of $CO_2$ admixed may be from about 25 sccm to about 1000 sccm and the amount of $O_2$ admixed may be from about 0.5 sccm to 50 sccm. More preferably, the amount of $CO_2$ is from about 50 sccm to about 500 sccm and the amount of $O_2$ is from about 1 sccm to about 30 sccm.

Figure 3:
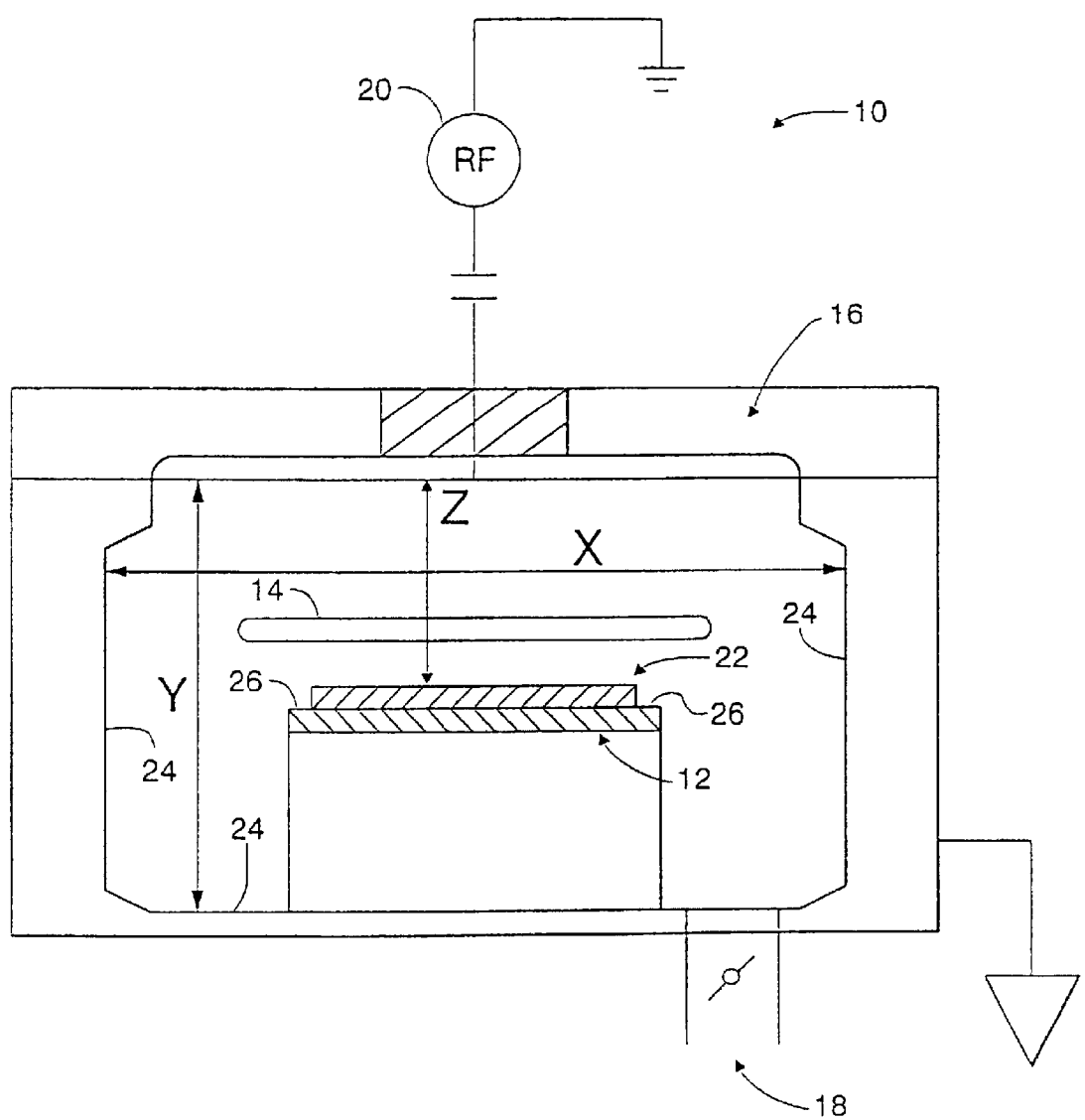
FIG. 3 depicts a cross-sectional view of a parallel plate chemical vapor deposition reactor according to the present invention.

As shown in FIG. 3, parallel plate plasma enhanced chemical vapor deposition ("PECVD) reactor 10 is the type used for processing 200 mm wafers. The inner diameter, X, of the reactor 10 is approximately 13 inches, while its height, Y, is approximately 8.5 inches. The diameter of substrate chuck 12 is approximately 10.8 inches. Reactant gases are introduced into reactor 10 through a gas distribution plate ("GDP") 16 that is spaced apart from substrate chuck 12 by a gap Z of about 1 inch, and are exhausted out of reactor 10 through a 3-inch exhaust port 18. RF power 20 is connected to GDP 16, which is electrically insulated from reactor 10, and substrate chuck 12 is grounded. For practical purposes, all other parts of the reactor are grounded. In a different embodiment, RF power 20 can be connected to substrate chuck 12 and transmitted to substrate 22. In this case, the substrate acquires a negative bias, whose value is dependent on the reactor geometry and plasma parameters. In another embodiment, more than one electrical power supply can be used. For instance, two power supplies can operate at the same RF frequency, or one may operate at a low frequency and one at a high frequency. The two power supplies may be connected both to the same electrode or to separate electrodes. In another embodiment, the RF power supply can be pulsed on and off during deposition. Process variables controlled during deposition of the low-k films are RF power, precursor mixture and flow rate, pressure in reactor, and substrate temperature.

Surfaces 24 of reactor 10 may be coated with an insulating coating material. For instance, one specific type of coating is applied on reactor walls 24 to a thickness of several mils. Another type of coating material that may be used on substrate chuck 12 is a thin coating of alumina or other insulator resistant to etching with an oxygen plasma. The temperature of the heated wafer chuck controls the substrate temperature.

In accordance the present invention, suitable first and second precursors and specific combination of processing parameters described herein above are employed such that the inventive ultralow-k material prepared preferably comprises: between about 5 and about 40 atomic percent of Si; between about 5 and about 45 atomic percent of C; between 0 and about 50 atomic percent of O; and between about 10 and about 55 atomic percent of H.

The main process variables controlled during a deposition process for a film are the RF power, the flow rates of the precursors, flow rate of $CO_2$, or flow rates of $CO_2$ and $O_2$, the reactor pressure and the substrate temperature. Provided herein below are several examples of deposition of films utilizing a first precursor tetramethylcyclotetrasiloxane (TMCTS) a second precursor cyclopentene oxide ("CPO"), as well as deposition of films in presence of $CO_2$ or $CO_2$ and $O_2$, according to the present invention. In examples 1–3, the TMCTS precursor vapors were transported into the reactor by using $CO_2$ as a carrier gas, while in example 4, the TMCTS precursor was transported by a liquid delivery system. Optionally, the films were heat treated at 400° C. after deposition to reduce k.

It should be emphasized that the improved fabrication method according to the present invention is only possible by utilizing a deposition reactor that has a specific geometry with uniquely defined growth conditions. When a reactor of different geometry is used under the defined growth conditions, the films produced may not achieve the ultralow dielectric constant. For instance, the parallel plate reactor according to the present invention should have an area of the substrate chuck of between about 300 $cm^2$ and about 700 $cm^2$, and preferably between about 500 $cm^2$ and about 600 $cm^2$. The gap between the substrate and the gas distribution plate (or top electrode) is between about 1 cm and about 10 cm, and preferably between about 1.5 cm and about 7 cm. A RF power is applied to one of the electrodes at a frequency between about 12 MHZ and about 15 MHZ, and preferably at about 13.56 MHZ. A low frequency, below 1 MHz, power can optionally be applied at the same electrode as the RF power, or to the opposite electrode at a power density of 0 to 0.3 $W/cm^2$.

The deposition conditions utilized are also critical to enable a successful implementation of the deposition process according to the present invention. For instance, a wafer temperature of between about 25° C. and about 325° C., and preferably of between about 60° C. and about 200° C. is utilized. A RF power density between about 0.05 $W/cm^2$ and about 1.0 $W/cm^2$, and preferably between about 0.25 $W/cm^2$ and about 0.8 $W/cm^2$ is utilized. A reactant gas flow rate of TMCTS between about 5 sccm and about 1000 sccm, and preferably between about 25 sccm and about 200 sccm is utilized. A reactant gas flow rate of CPO between about 5 sccm and about 1000 sccm, and preferably between about 10 sccm and about 120 sccm is utilized. A total reactant gas flow rate of TMCTS-$CO_2$, where $CO_2$ is used as a carrier gas is from about 25 sccm to about 1000 sccm, flow rates for $CO_2$ and $O_2$ mixture are respectively from about 25 sccm to 1000 sccm for $CO_2$ and from about 0.5 sccm to about 50 sccm for $O_2$, and flow rate for $CO_2$ from about 15 sccm to about 1000 sccm. A total reactant gas flow rate of TMCTS-$CO_2$, where $CO_2$ is used as a carrier gas is preferably from about 50 sccm to 500 sccm, flow rates for $CO_2$ and $O_2$ mixture are preferably respectively from about 50 sccm to about 500 sccm for $CO_2$ and from about 1 sccm to about 30 sccm for $O_2$, and flow rate for $CO_2$ preferably is from about 50 sccm to about 500 sccm. Reactor pressure during the deposition process between about 50 mTorr and about 5000 mTorr, and preferably between about 100 mTorr and about 3000 mTorr is utilized.

It should be noted that a change in the area of the substrate chuck by a factor, X, i.e., a change from a value in the range between about 300 $cm^2$ and about 700 $cm^2$, will change the RF power by a factor, X, from that previously specified. Similarly, a change in the area of the substrate chuck by a factor, Y, and a change in the gap between the gas distribution plate and the substrate chuck by a factor, Z, from that previously specified, will be associated with a change by a factor, YZ, in the gas flow rates from that previously specified. If a multistation deposition reactor is used, the area of the substrate refers to each individual substrate chuck and the flow rates of the gases refer to one individual deposition station. Accordingly, total flow rates and total power input to the reactor are multiplied by a total number of deposition stations inside the reactor.

The deposited films are stabilized before undergoing further integration processing. The stabilization process can be performed in a furnace-annealing step at about 300° C. to about 400° C. for a time period between about 0.5 hours arid about 4 hours. The stabilization process can also be performed in a rapid thermal annealing process at temperatures above about 300° C. The dielectric constants of the films obtained according to the present invention are lower than about 2.8. The thermal stability of the films obtained according to the present invention in non-oxidizing ambient is up to at least a temperature of about 400° C.

The following examples are presented to illustrate the fabrication of the ultralow-k dielectric film in accordance with the present invention as well as to demonstrate advantages that can be obtained therefrom:

EXAMPLE 1

In this example, according to FIG. 3, a wafer is first prepared by introducing the wafer into reactor 10 through a slit valve 14 and pre-etching the wafer by argon gas. In this wafer preparation process, the wafer temperature is set at about 180° C. and the argon flow rate is set at about 25 sccm, to achieve a pressure of about 100 mTorr. A RF power is then turned on to about 125 W for about 60 seconds. The RF power and the argon gas flow are then turned off.

The TMCTS precursor is carried into the reactor reactor using $CO_2$ as a carrier gas; $CO_2$ is at a pressure of about 5 psig at the inlet to the TMCTS container. The ultralow-k film according to the present invention can be deposited by first establishing gas flows of TMCTS+$CO_2$ and CPO to desired flow rates and pressure, i.e., at about 20 sccm of TMCTS+$CO_2$ and about 10 sccm of CPO and about 100 mTorr. A RF power is then turned on at about 15 W for a time period of about 50 minutes. The RF power and the gas flow are then turned off. The wafer is then removed from reaction reactor 10.

To reduce the dielectric constant of the deposited films and to further improve their thermal stability, i.e., to make them stable at temperatures greater than 300° C., the films are post annealed to evaporate the volatile contents and to dimensionally stabilize the films. The post annealing process can be carried out in an annealing furnace by the following steps. The furnace is first purged for about 5 minutes (with the film samples in a load station) with nitrogen at a flow rate of about 10 liters/minute. The film samples are then transferred into the furnace reactor to start the post annealing cycle of heating the films to about 280° C. at a heating rate of about 5° C./minute, holding at about 280° C. for about 5 minutes, heating at a second heating rate of about 5° C./minute to about 400° C., holding at about 400° C. for about 4 hours, turning the furnace off and allowing the film samples to cool to a temperature of below about 100° C. A suitable first holding temperature may be between about 280° C. and about 300° C., while a suitable second holding temperature may be between about 300° C. and about 400° C.

EXAMPLE 2

In this example, a wafer is prepared as described in Example 1, but the wafer temperature is set at about 300° C.

The TMCTS precursor is then carried into the reactor using $CO_2$ as a carrier gas; $CO_2$ is at a pressure of about 5 psig at the inlet to the TMCTS container. The ultralow-k film according to the present invention can be deposited by first establishing gas flows of TMCTS+$CO_2$ and CPO to desired flow rates and pressure, i.e., at about 150 sccm of TMCTS+$CO_2$ and about 75 sccm of CPO and about 2000 mTorr. A RF power is then turned on at about 150 W for a time period of about 10 minutes. The RF power and the gas flow are then turned off. The wafer is then removed from the reaction reactor 10 and annealed as described in Example 1.

In the foregoing examples, the plasma was operated in a continuous mode. In Example 3 herein below, the plasma is operated in a pulsed mode.

EXAMPLE 3

In this example, the deposition is performed under conditions similar to Example 1, but the plasma is operated in a pulsed mode, i.e., with a duty cycle of about 50% and a plasma-on time of about 50 msec to about 100 msec. After removal of the wafer from reactor 10, the wafer with the deposited film is annealed as described in Example 1.

EXAMPLE 4

In this example, a reactor including 6 deposition stations is used. The temperature of the wafer chuck is set at about 350° C. The TMCTS precursor is carried into the reactor using a liquid delivery system at a flow rate of about 5 ml/min, the CPO being flown at a rate of about 250 sccm and the pressure being stabilized at about 4000 mTorr. The $CO_2$ at a flow rate of about 5000 sccm and $O_2$ at a flow rate of about 250 sccm are admixed with the gas mixture of TMCTS and CPO in the reactor. The addition of the $CO_2$ and $O_2$ mixture stabilizes the plasma and improves the film uniformity. A total high frequency RF power of about 600 W and a low frequency RF power of about 300 W are applied to the reactor. The ultralow-k film deposition is performed on the wafer at each station with the wafer moving to the next station after a preset time interval. The wafer is removed from the reactor after passing the last deposition station, and the wafer may further be optionally annealed as particularly described in Example 1 hereinabove.

As described in the foregoing examples, the films that are prepared have dielectric constants in the range of about 2.0 to about 2.25.

A rapid thermal annealing ("RTA") process may also be used to stabilize ultralow-k films. The films obtained according to the present invention, are characterized by dielectric constants k less than about 2.8, and are thermally stable for integration in a back-end-of-the-line ("BEOL") interconnect structure, which is normally processed at temperatures of up to about 400° C. The teachings of the present invention can therefore be easily adapted in producing films as intralevel and interlevel dielectrics in back-end-of-the-line processes for logic and memory devices.

The improved method according to the present invention has therefore been thoroughly demonstrated in the above descriptions and in the appended drawings of FIGS. 1–3. It should be noted that the foregoing improved method may be applied in the fabrication of an indefinite number of electronic structures and devices.

While the present invention has been described in an illustrative manner, it should be understood that the terminology used is intended to be in a nature of words of description rather than of limitation.

Furthermore, while the present invention has been particularly shown and described with respect to a preferred embodiment and several alternate embodiments, it is to be appreciated that those skilled in the art may readily apply these teachings to other possible variations of the present invention without departing from the spirit and scope of the present invention.

The embodiments of the present invention in which exclusive property or privilege is claimed are defined below in the appended claims:

Having thus described our invention, what we claim as new and desire to secure by Letters Patent is:

1. A method for fabricating a thermally stable ultralow dielectric constant film comprising the steps of:
   providing a plasma enhanced chemical vapor deposition (PECVD) reactor;
   positioning a substrate in said PECVD reactor;
   flowing a first precursor gas comprising cyclic siloxane molecules into said PECVD reactor;
   flowing at least a second precursor gas comprising organic molecules with ring structures having C, H and O atoms into said PECVD reactor; and
   depositing a film comprising Si, C, O and H and a multiplicity of nanometer-sized pores on said substrate in presence of $CO_2$ or $CO_2$ and $O_2$.

2. The method according to claim 1, further comprising a step of mixing said first precursor gas with $CO_2$.

3. The method according to claim 2, wherein said step of depositing the film further comprises:
   setting a flow rate for said cyclic siloxane at between about 5 sccm and about 1000 sccm and setting a flow rate for said $CO_2$ at between about 25 sccm and 1000 sccm.

4. The method according to claim 3, wherein said flow rate for said cyclic siloxane is set at between about 25 sccm and about 200 sccm and said flow rate for said $CO_2$ is set at between about 50 sccm and about 500 sccm.

5. The method according to claim 3, wherein when said PECVD reactor includes a plurality of depositions stations then the flow rates of said cyclic siloxane are multiplied by a total number of deposition stations in said PECVD reactor.

6. The method according to claim 2, wherein said step of depositing said film further comprises:
   setting flow rates said for said organic molecules at between about 5 sccm and about 1000 sccm.

7. The method claim 6, wherein said flow rates for said organic molecules are at between about 25 sccm and about 200 sccm.

8. The method according to claim 1, further comprising a step of mixing said first precursor gas and said second precursor gas with $CO_2$ or a mixture Of $CO_2$ and $O_2$.

9. The method according to claim 8, wherein said step of depositing the film further comprises:
   setting a flow rate for said $CO_2$ at between about 25 sccm and about 1000 sccm and setting a flow rate for said $O_2$ at between about 0.5 sccm and about 50 sccm.

10. The method according to claim 9, wherein said flow rate for said $CO_2$ is set at between about 50 sccm and about 500 sccm and said flow rate for said $O_2$ is set at between about 1 sccm and about 30 sccm.

11. The method according to claim 1, wherein said PECVD reactor is of a parallel plate type reactor.

12. The method according to claim 1, wherein said film is optionally heated after deposition at a temperature not less than about 300° C. for at least about 0.25 hours.

13. The method according to claim 1, wherein said film has a dielectric constant of not more than about 2.8.

14. The method according to claim 1, wherein said film has a dielectric constant of not more than about 2.3.

15. The method according to claim 1, wherein said film has a dielectric constant in a range from about 1.5 to about 2.5.

16. The method according to claim 1, wherein said film comprises:
   between about 5 and about 40 atomic percent of Si;
   between about 5 and about 45 atomic percent of C;
   between 0 and about 50 atomic percent of O; and
   between about 10 and about 55 atomic percent of H.

17. The method according to claim 1, further comprising the step of:
   providing a parallel plate reactor having an area of a substrate chuck between about 300 $cm^2$ and about 700 $cm^2$, and a gap between the substrate and a top electrode between about 1 cm and about 10 cm.

18. The method according to claim 17, wherein a change in the area of said substrate chuck by a factor, X, changes the RF power by a factor, X.

19. The method according to claim 17, wherein a change in the area of the substrate chuck by a factor, Y, and a change in the gap between a gas distribution plate and the substrate chuck by a factor, Z, changes gas flow rates by a factor, YZ, such that residence time in plasma is maintained.

20. The method for fabricating a thermally stable ultralow dielectric constant film according to claim 4, said method further comprising the step of:
   applying a RF power to an electrode of said parallel plate PECVD reactor.

21. The method according to claim 1, further comprising a step of:
   heat treating said film at a temperature not higher than about 300° C. for a first time period and heat treating said film at a temperature not lower than about 300° C. for a second time period, said second time period being longer than said first time period.

22. The method according to claim 21, wherein said second time period is at least about ten times that of said first time period.

23. The method according to claim 1, wherein said cyclic siloxane is selected from the group consisting of: tetramethylcyclotetrasiloxane and octamethylcyclotetrasiloxane.

24. The method according to claim 1, wherein said cyclic siloxane is tetramethylcyclotetrasiloxane.

25. The method according to claim 1, wherein said organic molecules comprise species of fused rings including ring structures that impart significant ring strain, wherein said ring structures that impart significant ring strain include rings of 3, 4, 7 or more atoms.

26. The method according to claim 1, wherein said organic molecules are cyclopentene oxide.

27. The method according to claim 1, wherein said step of depositing the film further comprises the steps of:
   setting a temperature for said substrate at between about 25° C. and about 400° C.; and
   setting a RF power density at between about 0.05 $W/cm^2$ and about 2.0 $W/cm^2$.

28. The method according to claim 1, wherein said step of depositing said film further comprises:
   setting a pressure for said PECVD reactor at between about 50 mTorr and about 5000 mTorr.

29. The method according to claim 28, wherein said pressure for said PECVD reactor is between about 100 mTorr and about 4000 mTorr.

30. The method for fabricating a thermally stable ultralow dielectric constant film according to claim 28, wherein said flow rate ratio of said cyclopentene oxide to said tetramethylcyclotetrasiloxane is between about 0.2 and about 0.4.

31. The method according to claim 1, wherein said step of depositing said film further comprises:
setting a flow rate ratio of organic molecules of cyclopentene oxide to cyclic siloxane of tetramethylcyclotetrasiloxane to between about 0.1 and about 0.7.

32. The method according to claim 1, said method further comprising:
providing a parallel plate plasma enhanced chemical vapor deposition chamber.

33. The method according to claim 1, wherein plasma in said PECVD reactor is run in a continuous mode.

34. The method according to claim 1, wherein plasma in said PECVD reactor is run in a pulsed mode.

35. A method for fabricating a thermally stable ultralow-k film comprising the steps of:
providing parallel plate type plasma enhanced chemical vapor deposition (PECVD) reactor;
positioning a pre-processed wafer on a substrate chuck having an area between about 300 $cm^2$ and about 700 $cm^2$ and maintaining a gap between said wafer and a top electrode between about 1 cm and about 10 cm;
flowing a first precursor gas comprising cyclic siloxane molecules into said PECVD reactor;
flowing at least a second precursor gas comprising organic molecules with ring structures having C, H and O atoms; and
depositing an ultralow-k film on said wafer in presence of $CO_2$ or $CO_2$ and $O_2$.

36. The method according to claim 35, further comprising a step of mixing said first precursor gas with $CO_2$.

37. The method according to claim 36, wherein said step of depositing the film further comprises:
setting a flow rate for said first precursor at between about 5 sccm and about 1000 sccm and setting a flow rate for said $CO_2$ at between 25 sccm and 1000 sccm.

38. The method according to claim 37, wherein said flow rate for said first precursor is set at between about 25 sccm and about 200 sccm and said flow rate for said $CO_2$ is set at between about 50 sccm and about 500 sccm.

39. The method according to claim 35, further comprising a step of mixing said first precursor gas and at least said second precursor gas with $CO_2$ or a mixture of $CO_2$ and $O_2$.

40. The method according to claim 39, wherein the step of depositing the film further comprises:
setting a flow rate for said $CO_2$ at between about 25 sccm and about 1000 sccm and a flow rate for $O_2$ at between about 0.5 sccm and about 50 sccm.

41. The method according to claim 40, wherein said flow rate for said $CO_2$ is set at between about 50 sccm and about 500 sccm and said flow rate for said $O_2$ is set at between about 1 sccm and about 30 sccm.

42. A method for fabricating a thermally stable ultralow-k film comprising the steps of:
providing a parallel plate type plasma enhanced chemical vapor deposition (PECVD) reactor;
positioning a wafer on a substrate chuck having an area between about 300 $cm^2$ and about 700 $cm^2$, and maintaining a gap between the wafer and a top electrode between about 1 cm and about 10 cm;
flowing into said reactor over said wafer kept at a temperature between about 25° C. and about 400° C., a first precursor gas of a cyclic siloxane, and a second precursor gas of organic molecules, while keeping a pressure in said reactor between about 50 mTorr and about 5000 mTorr;
depositing an ultralow-k film on said wafer under a RF power density between about 0.05 $W/cm^2$ and about 2.0 $W/cm^2$ in presence of $CO_2$ or $CO_2$ and $O_2$; and
annealing said ultralow-k film at a temperature not less than about 300° C. for at least about 0.25 hour.

43. The method according to claim 42, further comprising a step of mixing said first precursor gas with $CO_2$.

44. The method according to claim 43, wherein said step of depositing the film further comprises:
setting a flow rate for said first precursor at between about 5 sccm and about 1000 sccm and setting a flow rate for said $CO_2$ at between about 25 sccm and about 1000 sccm.

45. The method according to claim 44, wherein said flow rate for said first precursor is set at between about 25 sccm and about 200 sccm and said flow rate for said $CO_2$ is set at between about 50 sccm and about 500 sccm.

46. The method according to claim 42, further comprising a step of mixing said first precursor gas and at least said second precursor gas with $CO_2$ or a mixture of $CO_2$ and $O_2$.

47. The method according to claim 46, wherein the step of depositing the film further comprises:
setting a flow rate for said $CO_2$ at between about 25 sccm and about 1000 sccm and a flow rate for $O_2$ at between about 0.5 XX sccm and about 50 YY sccm.

48. The method according to claim 47, wherein said flow rate for said $CO_2$ is set at between about 50 sccm and about 500 sccm and said flow rate for said $O_2$ is set at between about 1 sccm and about 30 sccm.

49. A method for fabricating a thermally stable ultralow-k film comprising the steps of:
providing a parallel plate type plasma enhanced chemical vapor deposition (PECVD) reactor;
positioning a wafer on a substrate chuck having an area between about 500 $cm^2$ and about 600 $cm^2$, and maintaining a gap between the wafer and a top electrode between about 1 cm and about 7 cm;
flowing a first precursor gas of a cyclic siloxane into said reactor over said wafer kept at a temperature between about 60° C. and about 200° C. and a second precursor of organic molecules while keeping a pressure in said reactor between about 100 mTorr and about 3000 mTorr;
depositing an ultralow-k film on said wafer under a RF power density between about 0.25 $W/cm^2$ and about 0.8 $W/cm^2$ in presence of $CO_2$ or $CO_2$ and $O_2$; and
annealing said ultralow-k film at a temperature not less than about 300° C. for at least about 0.25 hour 50. The method according to claim 49, further comprising a step of mixing said first precursor gas with $CO_2$.

51. The method according to claim 50, wherein said step of depositing the film further comprises:
setting a flow rate for said first precursor at between about 5 sccm and about 1000 sccm and setting a flow rate for said $CO_2$ at between about 25 XX sccm and about 1000 sccm.

52. The method according to claim 51, wherein said flow rate for said first precursor is set at between about 25 sccm and about 200 sccm and said flow rate for said $CO_2$ is set at between about 50 sccm and about 500 sccm.

53. The method according to claim 49, further comprising a step of mixing said first precursor gas and at least said second precursor gas with $CO_2$ or a mixture of $CO_2$ and $O_2$.

54. The method according to claim 53, wherein the step of depositing the film further comprises:

setting a flow rate for said $CO_2$ at between about 25 sccm and about 100 sccm and a flow rate for $O_2$ at between about 0.5 XX sccm and about 50 sccm.

55. The method according to claim 54, wherein said flow rate for said $CO_2$ is set at between about 50 sccm and about 500 sccm and said flow rate for said $O_2$ is set at between about 1 sccm and about 30 sccm.

56. A method for fabricating a thermally stable ultralow dielectric constant film comprising the steps of:

providing a plasma enhanced chemical vapor deposition (PECVD) reactor;

positioning a substrate in said PECVD reactor;

flowing a first precursor gas comprising cyclic siloxane molecules using $CO_2$ as a carrier gas into said PECVD reactor;

flowing at least a second precursor gas comprising organic molecules with ring structures having C, H and O atoms into said PECVD reactor; and depositing a film comprising Si, C, O and H and a multiplicity of nanometer-sized pores on said substrate in presence of said $CO_2$.

57. The method according to claim 56, wherein a flow rate of said first precursor is from about 5 sccm and about 1000 sccm and a flow rate of said $CO_2$ is from about 25 sccm and about 1000 sccm.

58. The method according to claim 57, wherein the flow rate for said first precursor is from about 25 sccm to about 200 sccm and the flow rate of said $CO_2$ is from about 50 sccm to about 500 sccm.

59. A method for fabricating a thermally stable ultralow dielectric constant film comprising the steps of:

providing a plasma enhanced chemical vapor deposition (PECVD) reactor;

positioning a substrate in said PECVD reactor;

flowing a first precursor gas comprising cyclic siloxane molecules into said PECVD reactor;

flowing at least a second precursor gas comprising organic molecules with ring structures having C, H and O atoms into said PECVD reactor;

flowing $CO_2$ into said PECVD reactor;

depositing a film comprising Si, C, O and H and a multiplicity of nanometer-sized pores on said substrate in presence of said $CO_2$.

60. The method according to claim 59, wherein a flow rate of said $CO_2$ is from about 25 sccm and about 1000 sccm.

61. The method according to claim 60, wherein the flow rate of said $CO_2$ is from about 50 sccm to about 500 sccm.

62. A method for fabricating a thermally stable ultralow dielectric constant film comprising the steps of:

providing a plasma enhanced chemical vapor deposition (PECVD) reactor;

positioning a substrate in said PECVD reactor;

flowing a first precursor gas comprising cyclic siloxane molecules into said PECVD reactor;

flowing at least a second precursor gas comprising organic molecules with ring structures having C, H and O atoms into said PECVD reactor;

flowing a mixture of $CO_2$ and $O_2$ into the PECVD reactor; and depositing a film comprising Si, C, O and H and a multiplicity of nanometer-sized pores on said substrate in presence of said $CO_2$ and $O_2$.

63. The method according to claim 62, wherein the $CO_2$ is flown at a flow rate from about 25 sccm to about 1000 sccm and said $O_2$ is flown at a flow rate from about 0.5 sccm to about 50 sccm.

64. The method according to claim 63, wherein the flow rate of $CO_2$ is form about 50 sccm to about 500 sccm and the flow rate of said $O_2$ is from about 1 sccm to about 30 sccm.

* * * * *